United States Patent
Sadanaga et al.

(10) Patent No.: US 10,418,875 B2
(45) Date of Patent: Sep. 17, 2019

(54) THERMAL INSULATION STRUCTURE FOR ELECTRONIC DEVICE, MOTOR PROVIDED WITH SAID THERMAL INSULATION STRUCTURE, AND METHOD FOR FORMING THERMAL INSULATION MEMBER FOR ELECTRONIC DEVICE

(71) Applicant: Panasonic Intellectual Property Management Co., Ltd., Osaka (JP)

(72) Inventors: Yuichiro Sadanaga, Osaka (JP); Kenji Kondo, Nara (JP); Takeshi Sakata, Osaka (JP); Masanori Morita, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 51 days.

(21) Appl. No.: 15/325,514

(22) PCT Filed: Jul. 29, 2015

(86) PCT No.: PCT/JP2015/003809
§ 371 (c)(1),
(2) Date: Jan. 11, 2017

(87) PCT Pub. No.: WO2016/017164
PCT Pub. Date: Feb. 4, 2016

(65) Prior Publication Data
US 2017/0194829 A1 Jul. 6, 2017

(30) Foreign Application Priority Data

Aug. 1, 2014 (JP) ................................. 2014-157522

(51) Int. Cl.
*H02K 5/08* (2006.01)
*F16L 59/02* (2006.01)
(Continued)

(52) U.S. Cl.
CPC ............... *H02K 5/08* (2013.01); *B29C 69/02* (2013.01); *F16L 59/02* (2013.01); *H02K 5/04* (2013.01);
(Continued)

(58) Field of Classification Search
CPC .. H02K 5/08; H02K 5/18; H02K 5/22; H02K 5/225; H02K 11/30–38
(Continued)

(56) References Cited

U.S. PATENT DOCUMENTS

2005/0100728 A1* 5/2005 Ristic-Lehmann ........................ A41D 19/01529
428/323
2006/0158049 A1* 7/2006 Suzuki ................... H02K 11/33
310/52

(Continued)

FOREIGN PATENT DOCUMENTS

CN 1875060 A 12/2006
CN 101197509 A 6/2008
(Continued)

OTHER PUBLICATIONS

The Extended European Search Report dated Jul. 20, 2017 for the related European Patent Application No. 15826766.6.
(Continued)

*Primary Examiner* — Michael Andrews
*Assistant Examiner* — Minki Chang
(74) *Attorney, Agent, or Firm* — McDermott Will & Emery LLP

(57) ABSTRACT

A thermal insulation structure for an electronic device of the present invention is a thermal insulation structure which thermally insulates between an electronic circuit unit and a heat generator formed with another component. In the thermal insulation structure, a partition wall for separating (Continued)

each space and formed of resin having electric insulation properties is provided between the electronic circuit unit and the heat generator. Also, the partition wall is formed by integrating the resin and a thermal insulation material having thermal conductivity lower than thermal conductivity of air so that the resin includes the thermal insulation material. Further, the partition wall is formed by insert-molding the thermal insulation material with the resin. Further, the resin having the electric insulation properties is thermoplastic resin, and a thermal insulation raw material of the thermal insulation material is silica xerogel.

5 Claims, 4 Drawing Sheets

(51) Int. Cl.
| | |
|---|---|
| H02K 5/04 | (2006.01) |
| H02K 11/00 | (2016.01) |
| H02K 11/33 | (2016.01) |
| B29C 69/02 | (2006.01) |
| H05K 7/20 | (2006.01) |
| B29K 81/00 | (2006.01) |
| B29L 31/00 | (2006.01) |

(52) U.S. Cl.
CPC ............ *H02K 11/00* (2013.01); *H02K 11/33* (2016.01); *B29K 2081/04* (2013.01); *B29K 2995/0015* (2013.01); *B29L 2031/749* (2013.01); *H02K 2211/03* (2013.01); *H05K 7/20* (2013.01)

(58) Field of Classification Search
USPC .......................................... 310/52, 68 D, 418
See application file for complete search history.

(56) References Cited

U.S. PATENT DOCUMENTS

| | | | |
|---|---|---|---|
| 2008/0136278 A1 | 6/2008 | Lee | |
| 2008/0136287 A1 | 6/2008 | Lee | |
| 2009/0078489 A1* | 3/2009 | Feier | F16H 61/0006 180/339 |
| 2010/0001595 A1 | 1/2010 | Inokuchi et al. | |
| 2010/0281806 A1 | 11/2010 | Takei et al. | |
| 2014/0054991 A1 | 2/2014 | Hyodo | |
| 2014/0057083 A1 | 2/2014 | Imae et al. | |
| 2014/0361648 A1* | 12/2014 | Shirakata | H02K 11/046 310/52 |

FOREIGN PATENT DOCUMENTS

| | | | |
|---|---|---|---|
| CN | 101197513 A | | 6/2008 |
| EP | 2141786 A1 | | 1/2010 |
| EP | 2615132 A1 | | 7/2013 |
| JP | 10-271763 | | 10/1998 |
| JP | 11-155257 A | | 6/1999 |
| JP | 11-234948 | | 8/1999 |
| JP | 2003-204886 | | 7/2003 |
| JP | 2004-081382 | | 3/2004 |
| JP | 2006-026977 A | | 2/2006 |
| JP | 2010-016965 | | 1/2010 |
| JP | 2011-166977 | | 8/2011 |
| JP | 2013-201804 A | | 10/2013 |
| JP | 2014-035041 | | 2/2014 |
| JP | 2014-035042 A | | 2/2014 |
| WO | 2005/047381 A1 | | 5/2005 |
| WO | 2009/069681 A1 | | 6/2009 |

OTHER PUBLICATIONS

English Translation of Chinese Search Report dated Jun. 19, 2018 for the related Chinese Patent Application No. 201580038089.3.
International Search Report of PCT application No. PCT/JP2015/003809 dated Oct. 27, 2015.
English Translation of Chinese Search Report dated Feb. 1, 2019 for the related Chinese Patent Application No. 201580038089.3.
Communication pursuant to Article 94(3) EPC dated May 10, 2019 for the related European Patent Application No. 15826766.6.

* cited by examiner

THERMAL INSULATION STRUCTURE FOR ELECTRONIC DEVICE, MOTOR PROVIDED WITH SAID THERMAL INSULATION STRUCTURE, AND METHOD FOR FORMING THERMAL INSULATION MEMBER FOR ELECTRONIC DEVICE

This application is a U.S. national stage application of the PCT international application No. PCT/JP2015/003809 filed on Jul. 29, 2015, which claims the benefit of foreign priority of Japanese patent application No. 2014-157522 filed on Aug. 1, 2014, the contents all of which are incorporated herein by reference.

TECHNICAL FIELD

The present invention relates to a thermal insulation structure for an electronic device and a method for forming a thermal insulation member for the electronic device, and particularly to a motor having the thermal insulation structure.

BACKGROUND ART

In recent years, electrification of a car has advanced, and a number of electronic devices mounted on a vehicle tends to increase year by year. Further, a control function required for each electronic device has been more sophisticated accordingly. For the electronic device incorporating an electronic circuit, it is essential to protect an electronic component mounted on a circuit board from an influence of heat.

Particularly, for the electronic component of the electronic device used around an engine room of the car (environment where peripheral temperature is 90° C. or more), improvement of thermal insulation properties suppressing transmission of heat transmitted from a periphery of the engine room is also required in addition to improvement of heat dissipation properties dissipating heat generated by itself.

Conventionally, as measures against a temperature rise of such an electronic component, for example, the following proposals have been made to improve the heat dissipation properties and the thermal insulation properties against heat from heat generator formed with another heat generating component (hereinafter, "heat generator formed with another heat generating component" is simply referred to and described as "heat generator" as appropriate).

PTL 1 discloses a mold motor in which a circuit board mounted with an electronic component for driving a motor and a stator of a magnetic circuit unit serving as a heat generator are integrally molded of thermosetting resin. Also, the mold motor in PTL 1 has a thermal insulation structure in which a thermal insulation layer having low thermal conductivity is provided between the circuit board and the stator.

Further, PTL 2 discloses a configuration in which a partition wall is provided between a circuit board and a stator serving as a heat generator of a motor similar to the above-described motor. Also, the motor in PTL 2 has a thermal insulation structure in which a rubber sheet with thermal insulation properties is stuck on a surface on a circuit board side of this partition wall or in which a paint with thermal insulation properties is applied onto the surface.

In PTL 1 or 2, by providing such a thermal insulation structure, transmission of heat from the stator to the electronic component on the circuit board is prevented, and a temperature rise of the electronic component is avoided.

Moreover, PTL 3 discloses, in a motor, means of sticking a heat reflection material on a partition wall similar to the above-described partition wall, of forming a plated layer on the partition wall, of forming the partition wall into a mirror finished metal plate, or the like. Also, the motor in PTL 3 attains thermal insulation of an electronic device by reflecting radiant heat of a heat generator by such means.

Further, PTL 4 discloses an electric water heater having a configuration in which a thermal insulation material is closely adhered to a water storage container to keep stored water warm. Also, in the electric water heater in PTL 4, a solidified thermal insulation material is used as this thermal insulation material. The thermal insulation material has excellent thermal insulation performance so that thermal conductivity of the material is lower than or equal to thermal conductivity of stationary air. Further, in PTL 4, silica xerogel known to have extremely high thermal insulation performance among non-vacuum thermal insulation materials is proposed as one example of a raw thermal insulation material of such a thermal insulation material.

However, the mold structure as in PTL 1 cannot sufficiently obtain a heat radiation effect by the mold resin, particularly, in a case where the mold structure is used in a condition where peripheral temperature is high, such as a periphery of an engine room. Also, even when the layer having the low thermal conductivity, such as an air layer, is provided, since thermal conductivity of the mold resin itself is not so low, the mold structure receives heat from the magnetic circuit unit serving as the heat generator via the mold resin. Temperature of the electronic component may thus exceed heat resistance temperature of the electronic component.

Further, as in PTL 2, in the configuration in which the rubber sheet with the thermal insulation properties is stuck to the partition wall provided between the electronic circuit unit and the heat generator, since thermal conductivity of the rubber sheet (about 0.2 W/m·K) is generally larger than thermal conductivity of the air (about 0.026 W/m·K), a thermal insulation effect is small. With this configuration, it is necessary to increase a thickness dimension to enhance the thermal insulation effect, and the size of the device may become larger. On the other hand, in the configuration in which the paint with the thermal induction properties is applied, even when a paint having high viscosity and capable of applying a thick film is used, multiple layers of the paint must be applied to enhance thermal insulation performance, and it takes much time. Moreover, since the viscosity of the paint is high, a special coating device is required, and further, large capital investment is required. Also, when a paint with low viscosity is used, film cannot be made thick, and the required thermal insulation performance cannot be obtained.

Moreover, as in PTL 3, in the method in which the radiant heat from the circuit board or the magnetic circuit unit is reflected, the heat is returned to a place where temperature is originally desired to be lowered by heat radiation. Accordingly, the method may cause a decrease in reliability or in performance due to the temperature increase.

Further, as in PTL 4, in a case of the thermal insulation material solidified with the silica xerogel, the silica xerogel is solidified using a powdered raw thermal insulation material and an aqueous binder, thereby forming a molded body serving as the thermal insulation material. However, the thermal insulation material formed in this way has a problem of powder falling. In other words, the raw thermal insulation material becomes powder and falls due to a lapse of time, vibrations from outside, or the like. Accordingly, a precision device or a device having a moving structure easily receives an adverse effect from the fallen powder. For example, in a case where the thermal insulation material is utilized for the motor, there is a problem in that the powder influences rotation operation of the motor.

CITATION LIST

Patent Literature

PTL 1: Unexamined Japanese Patent Publication No. 2011-166977
PTL 2: Unexamined Japanese Patent Publication No. H10-271763
PTL 3: Unexamined Japanese Patent Publication No. H11-234948
PTL 4: Unexamined Japanese Patent Publication No. 2003-204886

SUMMARY

A thermal insulation structure for an electronic device of the present invention is a thermal insulation structure which thermally insulates between an electronic circuit unit and a heat generator formed with another component. In the thermal insulation structure, a partition wall for separating each space and formed of resin having electric insulation properties is provided between the electronic circuit unit and the heat generator. Also, the partition wall is formed by integrating the resin and a thermal insulation material having thermal conductivity lower than thermal conductivity of air so that the resin includes the thermal insulation material.

Since the thermal insulation structure for the electronic device of the present invention has such a configuration, the thermal insulation structure can efficiently perform thermal insulation, while preventing a short circuit between the heat generator and an electronic component and preventing powder falling from the thermal insulation material. Because of this, according to the thermal insulation structure, the electronic component mounted on a circuit board of the electronic circuit unit can obtain high reliability.

Further, since a motor of the present invention includes such a thermal insulation structure of the electronic device, a motor suppressing a temperature rise of an electronic component and having no adverse effect such as powder falling can be provided.

Further, a method for forming a thermal insulation member for an electronic device of the present invention is a method for forming a thermal insulation member for the electronic device which thermally insulates between an electronic circuit unit and a heat generator formed with another component. The method for forming the thermal insulation member includes: impregnating a non-woven fabric serving as a sheet-like impregnated raw material with a thermal insulation raw material having thermal conductivity lower than thermal conductivity of air; holding and molding the non-woven fabric impregnated with the thermal insulation raw material, held by a film and forming a thermal insulation sheet; stamping out the thermal insulation sheet and generating a thermal insulation material; and insert-molding the thermal insulation material with resin and forming the thermal insulation member.

Since the method for forming the thermal insulation member for the electronic device of the present invention has such a configuration, the thermal insulation member having excellent thermal insulation performance and no powder falling or the like can be formed.

DESCRIPTION OF PREFERRED EMBODIMENTS

Exemplary embodiments of the present invention are described below with reference to the drawings and tables.

An electronic device used around an engine room of a car is, for example, a motor used by an electric oil pump which supplies hydraulic oil or lubricant to a hydraulic control device or the like of an automatic transmission. The following exemplary embodiments are described using a brushless motor for an electric oil pump to be used in a vehicle as an example of the electronic device.

First Exemplary Embodiment

Figure 1:
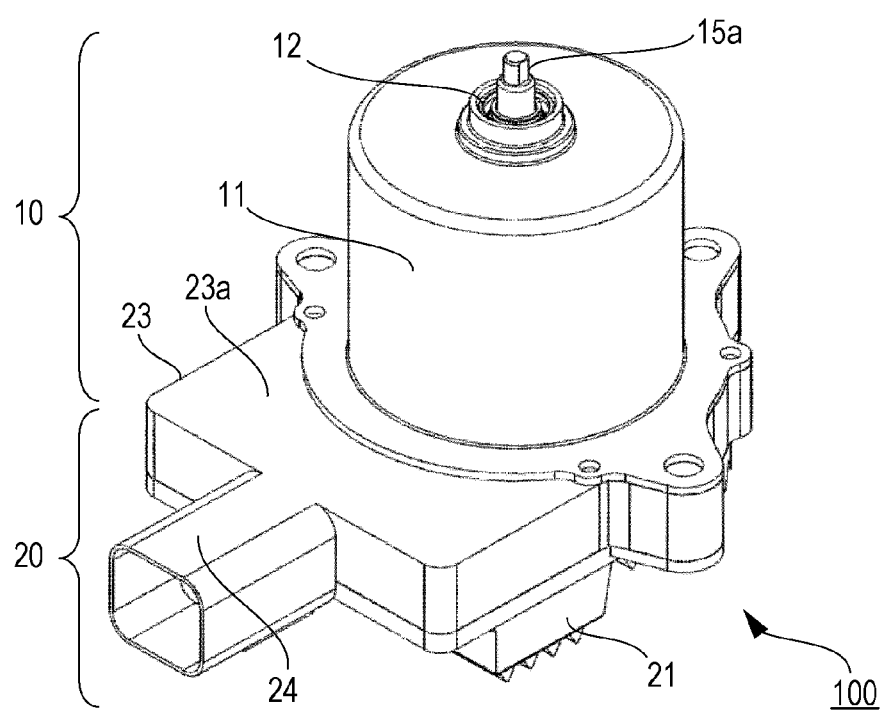
FIG. 1 is a perspective external view of a motor in a first exemplary embodiment of the present invention.
Figure 2:
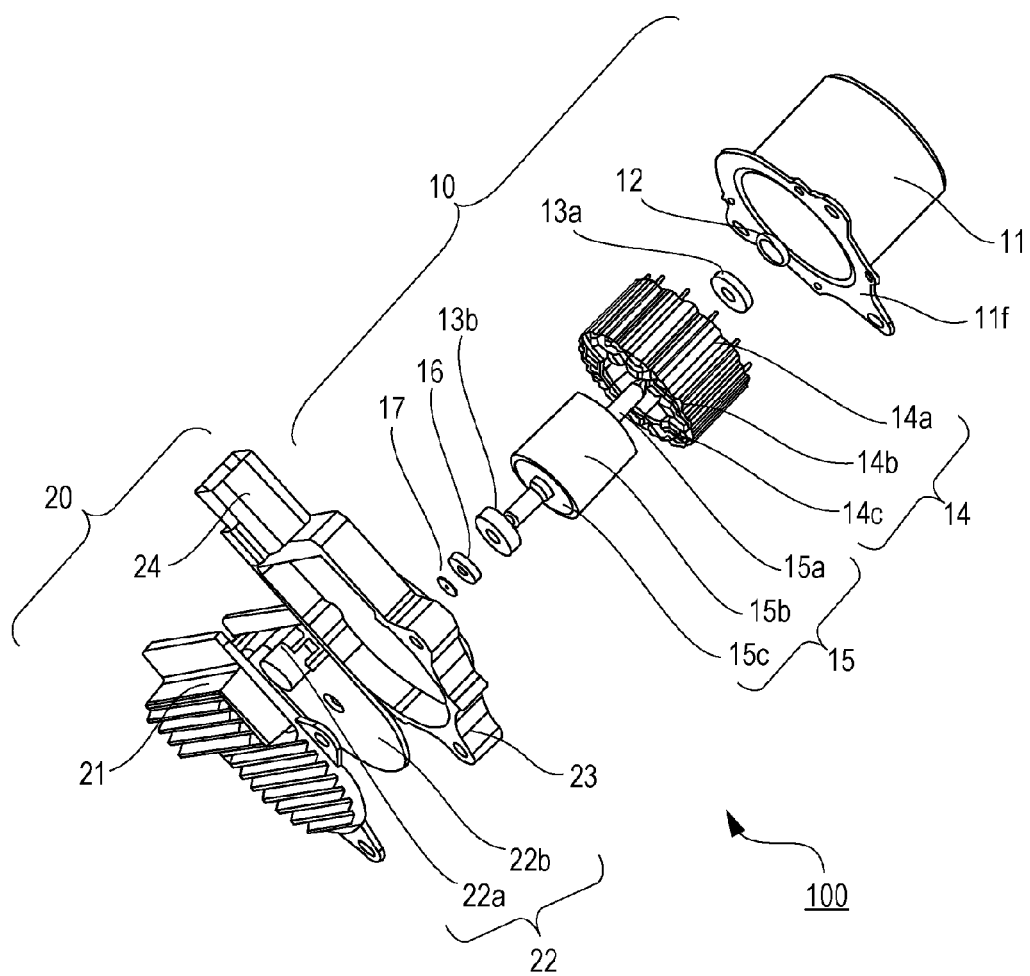
FIG. 2 is a perspective exploded view of the motor in the first exemplary embodiment of the present invention.
Figure 3:
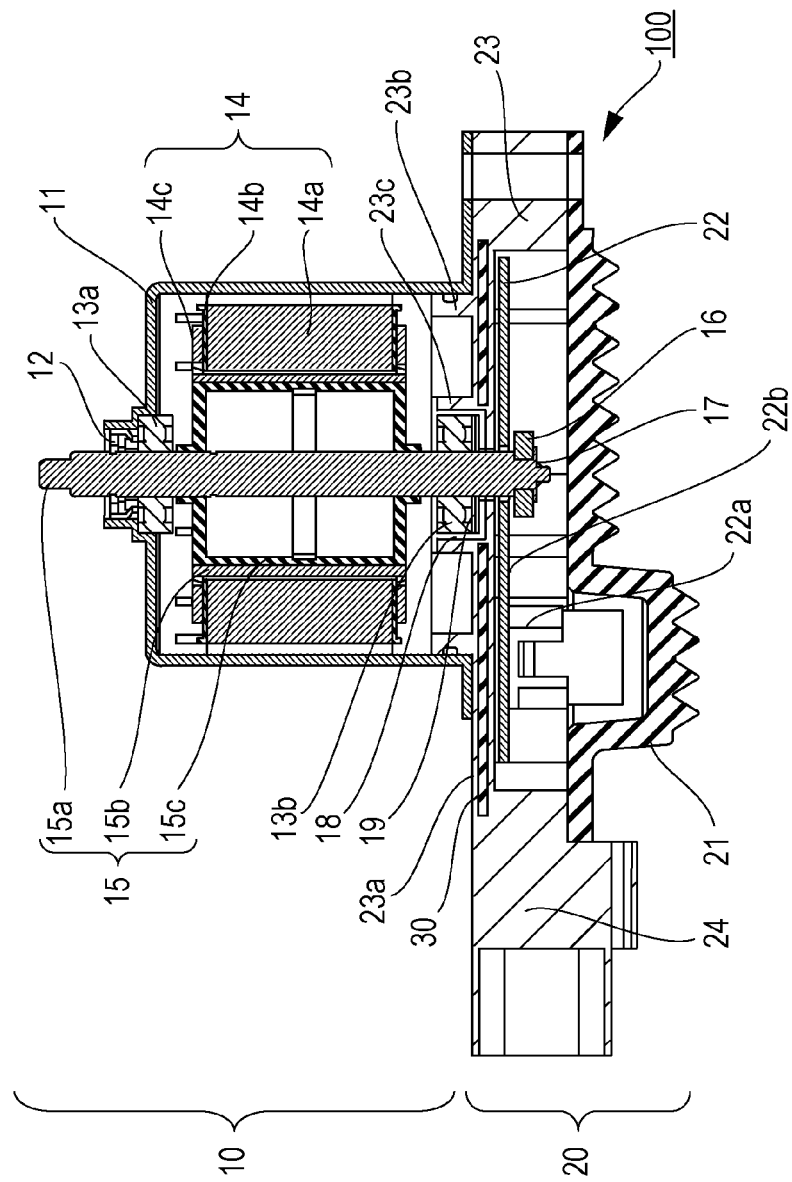
FIG. 3 is a sectional view of the motor in the first exemplary embodiment of the present invention.

FIG. 1 is a perspective view showing an external appearance of motor 100 in a first exemplary embodiment of the present invention. FIG. 2 is an exploded perspective view showing a configuration of motor 100 in the first exemplary embodiment of the present invention. FIG. 3 is a sectional view showing a side surface of motor 100 in the first exemplary embodiment of the present invention.

As shown in FIGS. 1, 2, 3, motor 100 serving as a brushless motor is configured to include bracket 23, motor frame 11 disposed on one side of bracket 23, and bottom plate 21 disposed on another side of bracket 23.

Details of motor 100 are described below. Stator 14 having a coil and rotor 15 having a permanent magnet and rotating around a shaft are stored inside motor frame 11. Magnetic circuit unit 10 is configured with these magnetic components and the like. As shown in FIG. 1, shaft 15a protrudes from a top surface of motor frame 11 via oil seal 12 as an output shaft. This shaft 15a functions as a motor due to rotation of shaft 15a. Further, circuit board 22 mounted with electronic components, which will be described below, is stored inside bracket 23. Electronic circuit unit 20 is configured with these electronic components and the like. Bracket 23 has connector 24 for supplying a power source and a signal to circuit board 22. Also, bottom plate 21 provided with heat radiation fins for radiating heat from the electronic components is disposed at a bottom part of bracket 23.

First, magnetic circuit unit 10 included between motor frame 11 and bracket 23 is described. Motor frame 11 is formed by processing an iron plate. A top surface is formed on one side of motor frame 11, and an opening part serving as an opening is formed on a bottom surface side serving as another side of motor frame 11. Motor frame 11 has a substantially cylindrical shape provided with a space inside. Also, flange 11f expanding from the opening part to an outer peripheral side is provided for assembling with resin bracket 23. Motor frame 11 and resin bracket 23 are fitted and fixed by means of press fitting, screw fastening, or the like.

Further, in magnetic circuit unit 10, bearing 13a and oil seal 12 are held on an output shaft side of motor frame 11, from which shaft 15a protrudes, as shown in FIG. 2. Also, stator 14 is press-fitted and fixed to an inner diameter part of motor frame 11, and rotor 15 is rotatably included in stator 14 via a gap.

Stator 14 is provided with stator core 14a, insulator 14b, and coil 14c. Stator core 14a is, for example, formed by laminating a plurality of steel plates and has a plurality of salient poles protruded on an inner peripheral side. Also, coil 14c is wound around each of the salient poles via insulator 14b formed of insulation resin or the like. Wound coil 14c is three-phase winding, and various winding patterns exist due to a number of poles of rotor magnet 15b, which will be described below.

Further, rotor 15 includes cylindrical rotor magnet 15b, substantially cup-shaped rotor frame 15c, and shaft 15a penetrating an inner peripheral side of rotor frame 15c. Rotor magnet 15b is formed of a permanent magnet, and is adhered and fixed to rotor frame 15c. Rotor magnet 15b has magnetic poles in which a north pole and a south pole are alternately disposed, and is magnetized with the number of poles of, for example, eight poles or ten poles. Rotor frame 15c is formed by processing an iron plate into the substantially cup shape. Two rotor frames 15c are configured by disposing oppositely in an axial direction so that respective rotor frames 15c face each other. Also, shaft 15a is press-fitted and fixed to an inner diameter hole of rotor frame 15c. Further, rotor frame 15c also serves as a back yoke for rotor magnet 15b, and constitutes a part of a magnetic path. Shaft 15a is made of metal, such as iron. An output side of shaft 15a is supported by bearing 13a and an opposite output side of shaft 15a is supported by bearing 13b so that shaft 15a is freely rotatable. Also, shaft 15a plays a role of transmitting a rotational output of motor 100 to an opposite side device, for example, an oil pump.

In order to connect with the opposite side device, a tip on the output side of shaft 15a is subjected to D-cut processing (processing in which a cylinder is formed into a D shape) or width across flat processing (processing in which the cylinder is formed into two mutually parallel surfaces). Moreover, in order to position and hold sensor magnet 16, the opposite output side of shaft 15a is subjected to the D-cut processing or the width across flat processing. Also, sensor magnet 16 is positioned by adhesion or press-fitting to a tip part on the opposite output side of shaft 15a and is fixed to the tip part by using means, such as push nut 17.

Next, electronic circuit unit 20 including circuit board 22 between bottom plate 21 and bracket 23 is described.

Bottom plate 21 is prepared by aluminum die-casting. Bottom plate 21 includes continuous substantially triangular heat radiation fins to radiate heat generated by electronic components 22a on circuit board 22.

Further, bracket 23 is formed of thermoplastic resin having electric insulation properties as a material. Bracket 23 has a substantially box-shaped structure which is thin in the axial direction. In bracket 23, a top part side is closed, an opening is formed on a bottom part side, and a space is provided inside. Further, the top part side of bracket 23 is closed by flat plate part 23a expanding in a flat plate shape. On a magnetic circuit unit 10 side of bracket 23, motor frame reception part 23b for receiving motor frame 11 and bearing reception part 23c for receiving bearing 13b are formed by protruding from flat plate part 23a toward magnetic circuit plate 10. Further, on the bottom part side of bracket 23, bottom plate 21 and bracket 23 are fixed by means of screw fastening or the like. Also, circuit board 22 is stored in the space inside bracket 23 closed so as to be covered with bottom plate 21.

Circuit board 22 has a configuration in which general electronic components 22a, such as an IC, a capacitor, and a chip part, are mounted on board 22b. Also, a drive circuit for energizing and driving coil 14c of stator 14 is configured by these electronic components 22a. Further, a hole, through which shaft 15a is passed, is opened at a center part of circuit board 22, and a hall element (not shown) is mounted as magnetism detection means around the hole. The hall element magnetizes sensor magnet 16 with a same pole and at a same position as rotor magnet 15b at such a position on circuit board 22 and detects a magnetic pole of magnetized sensor magnet 16.

It should be noted that, in this way, motor 100 of the present exemplary embodiment is not the mold motor in which the entire configuration including circuit board 22 is molded of the mold resin. In other words, motor 100 has a configuration in which stator 14 and rotor 15 are stored in the space inside motor frame 11 and circuit board 22 is stored in the space inside bracket 23. Accordingly, in the present exemplary embodiment, there is no stress generated on electronic components 22a mounted on circuit board 22 during molding or no influence caused by thermal expansion and thermal contraction on the mold resin after the molding. Moreover, in the present exemplary embodiment, since there is no damage done to electronic components 22a and an electric joint part between electronic components 22a and board 22b, reliability of electronic circuit unit 20 can be improved.

Next, bracket 23 storing circuit board 22 and structurally separating magnetic circuit unit 10 and electronic circuit unit 20 is described in detail.

The thermoplastic resin having electric insulation properties formed of polyphenylene sulfide resin (hereinafter referred to as PPS resin) is used for resin bracket 23. Also, bracket 23 in the present exemplary embodiment is formed by insert molding which includes and integrates various kinds of components, which will be described below.

In this way, in the present exemplary embodiment, bracket 23 is formed of the resin having the electric insulation properties. With this configuration, a short circuit between magnetic circuit unit 10 and electronic circuit unit 20 is prevented. Further, since magnetic circuit unit 10 includes coils 14c, an amount of heat generated from these coils 14c is large. Accordingly, in the present exemplary embodiment, the insert molding is performed so as to integrate the entire configuration including thermal insulation material 30, thereby forming bracket 23. Also, bracket 23 including thermal insulation material 30 is configured to be disposed between magnetic circuit unit 10 and electronic circuit unit 20. With this configuration, transmission of heat from coils 14c of stator 14 to electronic components 22a of circuit board 22 is suppressed. In other words, in the present exemplary embodiment, it is configured that bracket 23 for separating each space, formed of the resin having electric insulation properties, and serving as a partition wall is provided between electronic circuit unit 20 and magnetic circuit unit 10 serving as a heat generator. In the present exemplary embodiment, this configuration realizes a thermal insulation structure for an electronic device which thermally insulates electronic circuit unit 20 and magnetic circuit unit 10 formed of another component and serving as the heat generator. It should be noted that details of thermal insulation material 30 included in this bracket 23 are further described below.

Table 1 below shows a comparison of characteristics of synthetic resins used in the insert molding. Table 1 shows the comparison between the PPS resin in the present exemplary embodiment and thermosetting resin serving as a comparison example.

TABLE 1

| | Material | |
|---|---|---|
| Item | Thermoplastic Resin (PPS Resin) | Thermosetting Resin |
| Cost | ○ | ⊙ |
| Thermal Insulation Properties | Δ (0.3 W/m·K or Less) | X (0.5 W/m·K or More) |
| Moldability (Thin Wall) | ○ (0.3 mm or More) | Δ (1 mm or More) |
| Productivity (Tact) | ⊙ (Several Seconds) | X (Several Minutes) |
| Synthetic Judgement | ○ | X |

As shown in Table 1, thin-walled molding can be made and a degree of freedom of designing a shape is improved by preparing bracket 23 using the PPS resin. Moreover, since the PPS resin is used, even when the various kinds of components are included, sink marks are less, dimension stability can be secured, and the resin is excellent in moldability. Further, high productivity due to the small tact can be secured, and the PPS resin is low in cost. Moreover, the PPS resin is also excellent in heat resisting properties.

In bracket 23 made of PPS resin formed in this way, a positioning spigot joint having a fitted shape is provided on the magnetic circuit unit 10 side of bracket 23 to fit and fix motor frame 11. Bracket 23 is kept coaxial with magnetic circuit unit 10.

Further, in bracket 23, in order to insert bearing 13b, metal cup 18 with a through-hole opened at a center is integrated by insert molding with bearing reception part 23c on the magnetic circuit unit 10 side of bracket 23. Bracket 23 holds and fixes bearing 13b by metal cup 18 formed in this way. Here, since bearing 13b and metal cup 18 are formed of ferrous metal of a same kind, there is no relative change in a dimension caused by a difference in a coefficient of thermal expansion. Accordingly, a creep phenomenon can be prevented. Waveform washer 19 pressing rotor 15 in advance is inserted between bearing 13b and metal cup 18.

Further, an electronic circuit unit 20 side of bracket 23 made of PPS resin serves as a circuit holder which mechanically holds and fixes circuit board 22, and circuit board 22 is fixed by means of welding, screw fastening, or the like. Further, as an electric connection component, three-phase bus bars for connecting three-phase lead-out wires from coil 14c and connecting with circuit board 22, a power supply terminal, and a signal terminal are disposed in bracket 23 made of PPS resin while preserving electric insulation. Bracket 23 of the present exemplary embodiment includes these bus bars, power supply terminal, and the like to be insert molded.

Further, bracket 23 made of PPS resin also includes motor frame 11 and a nut for mechanically connecting and fixing to bottom plate 21 to be insert-molded. Since bracket 23 made of PPS resin includes these terminals and connection members made of metal to be insert-molded, a number of components or assembly man-hours can be reduced. Further, in order to easily perform electric connection to outside, connector 24 including the power supply terminal and the signal terminal is integrally molded with bracket 23 made of PPS resin, thereby forming a direct connector. By forming the direct connector, disconnection caused by bending of a lead wire for connection to the outside or lowering of sealing ability to an inside of the motor can be prevented, and the connector can be highly reliable.

As described above, motor 100 stores magnetic circuit unit 10 inside metal motor frame 11. Magnetic circuit unit 10 includes stator 14, around which coil 14c is wound, and rotor 15 facing stator 14 and rotatably disposed. Also, motor 100 incorporates electronic circuit unit 20 inside resin bracket 23 serving as a housing. Electronic circuit unit 20 includes circuit board 22 mounted with electronic component 22a for energizing and driving coil 14c. In this way, motor 100 is a motor also incorporating the drive circuit which electrically drives magnetic circuit unit 10 including a motor mechanism. Moreover, motor 100 is configured so that the top part side of bracket 23 including flat plate part 23a serves as the partition wall, and that magnetic circuit unit 10 and electronic circuit unit 20 is structurally separated by this top part side serving as the partition wall.

Also, in the present exemplary embodiment, thermal insulation material 30 which thermally separates magnetic circuit unit 10 and electronic circuit unit 20 is included in bracket 23 made of PPS resin by the insert molding, as mentioned above.

Here, as thermal insulation material 30 included in bracket 23, gelatinous silicon-based resin is used for a thermal insulation raw material. Particularly, in the present exemplary embodiment, silica xerogel serves as the thermal insulation raw material. Also, in the present exemplary embodiment, a thermal insulation sheet is first prepared according to procedures as follows.

In other words, first, a non-woven fabric formed of glass wool serving as a sheet-like impregnated raw material is impregnated with a thermal insulation material formed of silica xerogel serving as a thermal insulation raw material and having thermal conductivity (thermal conductivity: about 0.017 W/m·K) lower than thermal conductivity of air. Next, the non-woven fabric impregnated with the thermal insulation raw material is held by a film formed of, for example, a glass cloth and molded, whereby the thermal insulation sheet serving as a film-like thermal insulation material or a sheet-like thermal insulation material is formed.

Further, in the present exemplary embodiment, the thermal insulation sheet formed in this way is stamped out and die-cut into an arbitrary shape, thereby forming thermal insulation material 30. In this way, the present exemplary embodiment includes a procedure in which thermal insulation material 30 is formed by stamping out from the previously formed thermal insulation sheet. By adding such procedure of die-cutting thermal insulation material 30, thermal insulation material 30, for example, can have a desired shape so as to enhance a thermal insulation effect, and can be set to have a flexible thermal insulation structure.

In this way, in a method for forming a thermal insulation member in the present exemplary embodiment is a method for forming the thermal insulation member for the electronic device which thermally insulates between the electronic circuit unit and the heat generator formed with the other component. The method for forming the thermal insulation member includes: impregnating the non-woven fabric serving as the sheet-like impregnated raw material with the silica xerogel serving as the thermal insulation raw material; holding and molding the non-woven fabric impregnated with the thermal insulation raw material and forming the thermal insulation sheet; stamping out the thermal insulation sheet and generating the thermal insulation material; and insert-molding the thermal insulation material with the resin and forming the thermal insulation member.

Further, particularly, in the present exemplary embodiment, in the insert molding, thermal insulation material 30 formed in this way is configured so that the resin completely encloses an entire peripheral end part of thermal insulation material 30. Because of this, according to the present exemplary embodiment, even for a use in which vibrations are very large, such as for a car use, powder falling from the impregnated raw material or the thermal insulation raw material does not occur on a peripheral end surface of the thermal insulation material, and cleanliness can be secured. Also, sufficient heat resisting properties can be secured in use under high temperature environment (about 150° C.). Thus, the thermal insulation structure which is low in cost and excellent in moldability can be made.

Table 2 below shows characteristics of thermal insulation materials molded from various kinds of materials.

TABLE 2

| | Material | | |
| --- | --- | --- | --- |
| Item | Silica Xerogel | Vacuum Thermal Insulation Material | Urethane |
| Cost | ○ | X | ⊙ |
| Thermal Insulation Properties | ○ (0.017 W/m · K) | ⊙ (0.001 W/m · K) | X (0.023 W/m · K) |
| Moldability | ○ | X | ○ |
| Thermal Insulation Properties (150° C.) | ○ | X | X |
| Cleanliness (Foreign Matter of Less Than 100 μm) | X ⇒ ○ (Insert Molding) | ○ | X |
| Synthetic Judgement | ○ | X | X |

As shown in Table 2, thermal insulation material 30 is prepared by using the thermal insulation material formed of silica xerogel for the raw material. Accordingly, thermal insulation material 30 which has heat resisting properties capable of resisting even under the high temperature environment (about 150° C.), such as for a car use, and which is low in cost and excellent in moldability can be provided. Moreover, since the excellent thermal insulation structure can be obtained, it is possible to efficiently insulate heat generated in magnetic circuit unit 10 and to realize electronic circuit unit 20 having high reliability.

By using the above-described exemplary embodiment, the thermal insulation structure which secures reliability of the electronic component and is high in thermal insulation properties can be realized.

Second Exemplary Embodiment

Figure 4A:
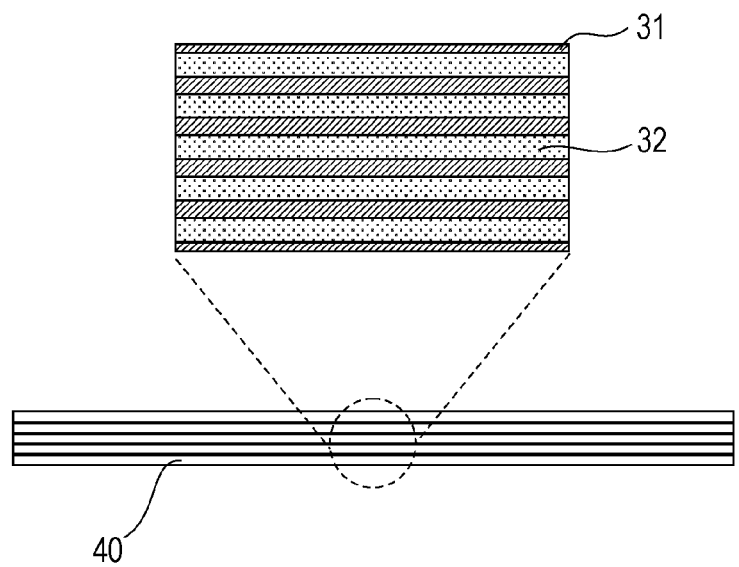
FIG. 4A is a view showing a cross section structure of a thermal insulation material in a second exemplary embodiment of the present invention.
Figure 4B:
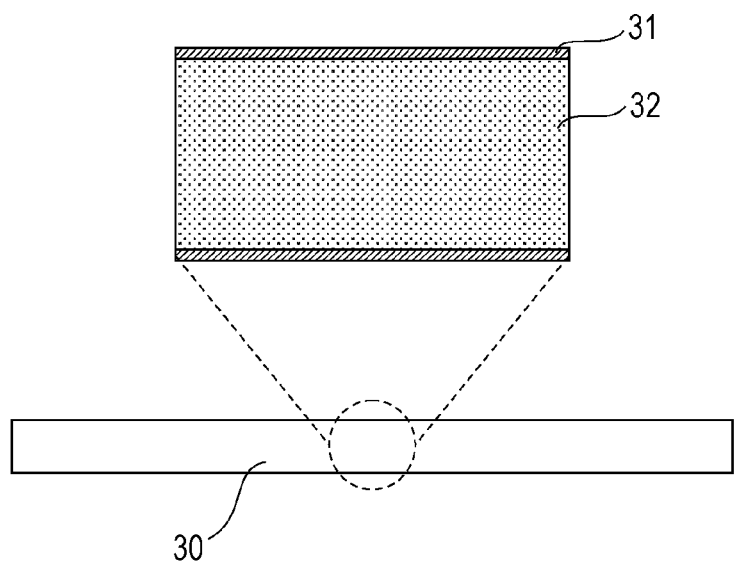
FIG. 4B is a view showing, to be compared with FIG. 4A, a cross section structure of a thermal insulation material in the first exemplary embodiment of the present invention.

FIG. 4A is a view showing a cross section structure of thermal insulation material 40 in a second exemplary embodiment of the present invention. Further, FIG. 4B is a view showing, to be compared with FIG. 4A, a cross section structure of thermal insulation material 30 in the first exemplary embodiment. In comparison with the first exemplary embodiment, in the present exemplary embodiment, the cross section structure of thermal insulation material 40 is formed into multilayers, as shown in FIG. 4A. It should be noted that, in the present exemplary embodiment, configurations other than the cross section structure of the thermal insulation material, such as a configuration of motor 100, are the same as the configurations in the first exemplary embodiment, and detailed description of the configurations is omitted. Hereinafter, thermal insulation material 40 having a multilayer structure in the present exemplary embodiment shown in FIG. 4A is described while comparing with thermal insulation material 30 having a single layer structure shown in FIG. 4B.

First, thermal insulation material 30 having the single layer structure shown in FIG. 4B is described. As described in the first exemplary embodiment, the non-woven fabric formed of glass wool and serving as the sheet-like impregnated raw material is impregnated with the thermal insulation material raw material which uses silica xerogel having thermal conductivity lower than thermal conductivity of air for the raw material. The non-woven fabric impregnated with the thermal insulation material raw material is held by the film formed of the glass cloth, thereby molding thermal insulation material 30. Also, the thermal conductivity of the thermal insulation material (about 0.017 W/m·K) is smaller than the thermal conductivity of the air (about 0.026 W/m·K). Moreover, in the cross section structure, as shown in FIG. 4B, layer 32 in which an impregnated raw material is impregnated with a thermal insulation material raw material (hereinafter referred to as intermediate layer 32) is formed in an intermediate part of the cross section. Also, thermal insulation raw material rich layer 31 including a larger amount of thermal insulation material raw material than intermediate layer 32 is formed on upper and lower surface layer parts of thermal insulation material 30. In this way, in thermal insulation material 30, a bias occurs in density distribution of the thermal insulation material raw material in a thickness direction.

In such a configuration of thermal insulation material 30, when a thickness dimension is increased to improve thermal insulation performance, the thermal conductivity tends to increase due to influence of the aforementioned bias in density distribution of the thermal insulation material raw material. For example, in a case where thermal insulation material 30 has a thickness of 0.3 mm and thermal conductivity of 0.017 W/m·K), when the thickness is increased to 1.5 mm, the thermal conductivity is increased to about 0.022 W/m·K.

Accordingly, in the present exemplary embodiment, the thermal insulation material has a laminate structure as shown in FIG. 4A, thereby preventing an increase in thermal conductivity.

As such an example, a total thickness of the thermal insulation material is 1.5 mm. FIG. 4B shows an example of thermal insulation material 30 configured with one sheet having a thickness of 1.5 mm, and FIG. 4A shows an example of thermal insulation material 40 configured by laminating five sheets each having a thickness of 0.3 mm. Thermal conductivity of thermal insulation raw material rich layer 31 is relatively low as compared with thermal conductivity of intermediate layer 32. Since a ratio of thermal insulation raw material rich layer 31 to the total thickness is large, the laminate structure shown in FIG. 4A can maintain the thermal conductivity of 0.017 W/m·K that is original performance.

By using the above-described exemplary embodiment, even in a case where the thickness of the thermal insulation material is increased, the thermal insulation structure having high thermal insulation properties can be realized without increasing the thermal conductivity.

It should be noted that the present invention is not limited to the brushless motor in the above-described exemplary embodiments or the motor shown in the drawings. For example, the respective exemplary embodiments described above can be implemented by an appropriate combination. Various design changes can be made without departing from a gist of the present invention.

INDUSTRIAL APPLICABILITY

As described above, since the thermal insulation structure for the electronic device according to the present invention can secure reliability of the electronic component, the thermal insulation structure can be applied not only to the onboard electronic device but also to an industrial electronic device, a household electronic device, or the like. Particularly, the thermal insulation structure is useful for a field requiring high heat resisting properties or reliability.

The invention claimed is:

1. A thermal insulation structure for an electronic device which thermally insulates between an electronic circuit unit and a heat generator comprising:
   a partition wall separating a first space which stores the electronic circuit unit, and a second space which stores the heat generator,
   wherein the partition wall includes:
      resin; and
      a thermal insulation sheet inserted in the resin,
   wherein thermal conductivity of the thermal insulation sheet is lower than thermal conductivity of air.

2. The thermal insulation structure for the electronic device according to claim 1, wherein the resin is thermoplastic resin.

3. The thermal insulation structure for the electronic device according to claim 1, wherein a thermal insulation raw material of the thermal insulation sheet is silica xerogel.

4. A motor comprising:
   a bracket including a flat plate part:
   a frame fixed on the flat plate part;
   a stator disposed in the frame; and
   a circuit board stored in the bracket and disposed under the flat plate part;
   wherein the flat plate part includes:
      resin; and
      a thermal insulation sheet inserted in the resin,
   wherein the frame disposed above the thermal insulation sheet, and
   wherein thermal conductivity of the thermal insulation sheet is lower than thermal conductivity of air.

5. The motor according to claim 4, wherein the frame includes an annular shaped flange assembled with the bracket and disposed on the flat plate part,
   wherein a part of the thermal insulation sheet inserted in an area of the flat plate part enclosed by the flange.

* * * * *